US009362086B2

(12) United States Patent
Tůma et al.

(10) Patent No.: US 9,362,086 B2
(45) Date of Patent: Jun. 7, 2016

(54) IN-COLUMN DETECTOR FOR PARTICLE-OPTICAL COLUMN

(71) Applicant: FEI Company, Hillsboro, OR (US)

(72) Inventors: Lubomír Tůma, Brno (CZ); Petr Hlavenka, Brno (CZ); Petr Sytař, Brno (CZ); Radek Češka, Brno (CZ); Bohuslav Sed'a, Blansko (CZ)

(73) Assignee: FEI Company, Hillsboro, OR (US)

( * ) Notice: Subject to any disclaimer, the term of this patent is extended or adjusted under 35 U.S.C. 154(b) by 289 days.

(21) Appl. No.: 13/975,809

(22) Filed: Aug. 26, 2013

(65) Prior Publication Data

US 2014/0097341 A1    Apr. 10, 2014

Related U.S. Application Data

(63) Continuation of application No. 13/456,944, filed on Apr. 26, 2012, now abandoned.

(60) Provisional application No. 61/479,190, filed on Apr. 26, 2011.

(30) Foreign Application Priority Data

Apr. 26, 2011    (EP) ..................................... 11163691

(51) Int. Cl.
*H01J 37/244*    (2006.01)
*H01J 37/21*    (2006.01)
(Continued)

(52) U.S. Cl.
CPC ............... *H01J 37/26* (2013.01); *H01J 37/145* (2013.01); *H01J 37/244* (2013.01); *H01J 37/28* (2013.01); *H01J 2237/04926* (2013.01); *H01J 2237/2443* (2013.01); *H01J 2237/24465* (2013.01)

(58) Field of Classification Search
CPC . H01J 2237/2448; H01J 37/145; H01J 37/26; H01J 37/244; H01J 37/28; H01J 2237/04926; H01J 2237/2443; H01J 2237/24465
USPC ........................................................ 250/396 R
See application file for complete search history.

(56) References Cited

U.S. PATENT DOCUMENTS 4,831,266 A    5/1989   Frosien et al.
4,926,054 A    5/1990   Frosien
(Continued)

FOREIGN PATENT DOCUMENTS

EP    2009705    12/2008
EP    2521157    11/2012
(Continued)

OTHER PUBLICATIONS

Vermeulen, Jan Pieter, et al., "New Developments in Gemini FESEM Technology," http://www.touchbriefings.com/pdf/1065/carlzeis_tech.pdf,, 2 pgs.
(Continued)

*Primary Examiner* — Brooke Purinton
(74) *Attorney, Agent, or Firm* — Scheinberg & Associates; Michael O. Scheinberg

(57) ABSTRACT

The invention relates to an in-column back-scattered electron detector, the detector placed in a combined electrostatic/magnetic objective lens for a SEM. The detector is formed as a charged particle sensitive surface, preferably a scintillator disk that acts as one of the electrode faces forming the electrostatic focusing field. The photons generated in the scintillator are detected by a photon detector, such as a photo-diode or a multi-pixel photon detector. The objective lens may be equipped with another electron detector for detecting secondary electrons that are kept closer to the axis. A light guide may be used to offer electrical insulation between the photon detector and the scintillator.

21 Claims, 4 Drawing Sheets

(51) Int. Cl.
*H01J 37/26* (2006.01)
*H01J 37/145* (2006.01)
*H01J 37/28* (2006.01)

(56) References Cited

U.S. PATENT DOCUMENTS

| | | | |
|---|---|---|---|
| 5,396,067 | A | 3/1995 | Suzuki et al. |
| 5,578,822 | A | 11/1996 | Van Der Mast et al. |
| 5,945,672 | A | 8/1999 | Knowles et al. |
| 6,194,729 | B1 | 2/2001 | Weimer |
| 6,946,654 | B2 | 9/2005 | Gerlach et al. |
| 7,544,937 | B2 * | 6/2009 | Frosien ............ 250/310 |
| 7,718,979 | B2 | 5/2010 | Knowles |
| 2003/0010913 | A1 | 1/2003 | Essers |
| 2005/0173644 | A1 | 8/2005 | Gnauck et al. |
| 2006/0054814 | A1 * | 3/2006 | Shemesh ............ G01N 23/2251 250/310 |
| 2007/0285643 | A1 | 12/2007 | Wedowski et al. |
| 2009/0314937 | A1 | 12/2009 | Sellmair |
| 2010/0038538 | A1 | 2/2010 | Drexel |
| 2012/0037802 | A1 | 2/2012 | Kneedler |
| 2012/0199740 | A1 | 8/2012 | Zeidler et al. |
| 2012/0205539 | A1 | 8/2012 | Hlavenka et al. |

FOREIGN PATENT DOCUMENTS

| | | |
|---|---|---|
| JP | 10134754 | 5/1998 |
| JP | H10134754 | 5/1998 |

OTHER PUBLICATIONS

Liu, Weidong, "Electron Specimen Interaction in Low Voltage Electron Beam Lithography," monthly progress reports, Jul. 1995-Oct. 1995, http://handle.dtic.mil/100.2/ADA327202.

* cited by examiner

IN-COLUMN DETECTOR FOR PARTICLE-OPTICAL COLUMN

This application is a Continuation Application of U.S. patent application Ser. No. 13/456,944, filed Apr. 26, 2012, which claims priority from U.S. Prov. Pat. App. 61/479,190, filed Apr. 26, 2011, both of which are hereby incorporated by reference.

TECHNICAL FIELD OF THE INVENTION

The invention relates to a particle-optical apparatus equipped with an in-column back-scattered electron detector, and method for using thereof.

BACKGROUND OF THE INVENTION

The column known from U.S. Pat. No. 4,831,266 describes an electron-optical column comprising an electron source and a combined magnetic/electrostatic objective lens round the optical axis. The magnetic part of the lens comprises two pole pieces at ground potential, a first pole piece close to the sample and a second pole piece more removed from the sample.

The electrostatic lens consists of a first electrode in the form of an aperture round an optical axis near the sample. This first electrode coincides with the first pole piece. A second electrode in the form of a flaring tube surrounds the optical axis between the first electrode and the electron source. The tube has a small diameter at the side of the sample, and a larger diameter at the side of the electron source. The second electrode is kept at a potential $U_{KE}$ with respect to the sample and the magnetic pole pieces. A third electrode in the form of a tube with a small diameter is placed round the optical axis between the second electrode and the source. The third electrode is kept at a potential $U_{RE}$ with respect to the sample.

A detector comprising for example a scintillator disk with light guide or a semiconductor disk (such as a PIN diode) surrounds the third electrode in a detector plane perpendicular to the optical axis. The detector is kept at the potential of the second electrode, $U_{KE}$, the potential of the second electrode.

When the primary beam hits a sample, secondary radiation including secondary electrons (SE's, defined as electrons having an energy of less than 50 eV, more specifically having an energy of 5 eV or less) and back-scattered electrons (BSEs, defined as having an energy above 50 eV up to the energy of the impinging electrons) are generated.

The SEs are kept close to the axis of the objective lens due to the combined effect of the electrostatic and the magnetic field breaking out of the lens. The known patent teaches that a cross-over is formed between the sample and the detector, as a result of which a diverging beam illuminates the detector. The detector thus detects a large fraction of the SEs and also some of the BSEs.

A disadvantage of the column disclosed in the known patent is the low efficiency with which BSEs are detected.

U.S. Pat. No. 4,926,054 discloses a lens similar to the lens disclosed in U.S. Pat. No. 4,831,266 showing an additional control electrode between the sample and the yoke of the magnetic lens, so that the position of the cross-over of the SEs can be tuned. By placing an aperture at the position of the cross-over, BSEs are blocked and an image of almost exclusively SEs can be formed.

A disadvantage of the column disclosed in U.S. Pat. No. 4,926,054 is that the detection efficiency of BSEs is low and that still another control electrode and associated power supply is needed, resulting in a still more complex lens.

Accordingly, there is a need to provide a solution for efficiently detecting back-scattered electrons.

SUMMARY OF THE INVENTION

The invention relates to an in-column back-scattered electron detector, the detector placed in a combined electrostatic/magnetic objective lens for a SEM. The detector is formed as a charged particle sensitive surface, preferably a scintillator disk that acts as one of the electrode faces forming the electrostatic focusing field. The photons generated in the scintillator are detected by a photon detector, such as a photo-diode or a multi-pixel photon detector. The objective lens may be equipped with another electron detector for detecting secondary electrons that are kept closer to the axis. A light guide may be used to offer electrical insulation between the photon detector and the scintillator.

The invention further relates to a method of using a particle-optical apparatus equipped with such an in-column back-scattered electron detector.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DESCRIPTION OF PREFERRED EMBODIMENTS

The invention relates to a charged particle column comprising: a charged particle source for producing a beam of charged particles, a sample carrier for holding and positioning a sample, an objective lens for focusing the beam of charged particles on the sample, the objective lens having: a first and a second electrode for generating a focusing electrostatic field, the first electrode positioned between the second electrode and the sample carrier, and a first and a second pole piece for generating a focusing magnetic field, the first pole piece positioned between the second pole piece and the sample carrier, the electrostatic field and the magnetic field showing overlap, a detector at the source side of the first electrode for detecting charged particles, the detector showing a surface sensitive to charged particles.

Embodiment of the invention are characterized in that the second electrode shows an electrode surface facing to the sample position, and the charged particle sensitive surface forms at least part of said electrode surface.

Inventors found that, by combining the sensitive surface of the detector with a surface of the second electrode facing the sample, and by appropriate excitation of the magnetic and the electrostatic (two-electrode) lens, the need for a third electrode and its associated supply disappears without compromising the performance of lens or detector efficiency.

It is noted that the pole pieces may be at ground potential, but that this is not required. The same holds for the sample and sample carrier, which may be at the same potential as the first electrode, but may also be biased with respect to the first electrode and first pole piece.

It is noted that In "New Developments in GEMINI® FESEM Technology", J. P. Vermeulen (http://www.touch-briefings.com/pdf/1065/carlzeiss_tech.pdf), an even more complex detector is disclosed, in which the SEs are detected by a first detector and the BSEs are detected by a second detector more removed from the sample. The SEs form a cross-over between the sample and the first detector so as to illuminate the first detector with a diverging beam, while the BSEs according to FIG. 7 of said publication form a cross-over at the position of the first detector. As the first detector shows a central hole (for passing the primary beam and the beam of back-scattered electrons), most of the BSEs passed through the first detector to be detected by the second detector.

It is further noted that the detector plane described in U.S. Pat. Nos. 4,831,266 and 4,926,054 can be thought of as an electrode, but this electrode is not the electrode for generating the focusing electrostatic field. Even if it is argued that any field parallel to the axis focuses the beam, then this field does not show overlap with the magnetic focusing field.

Figure 4:
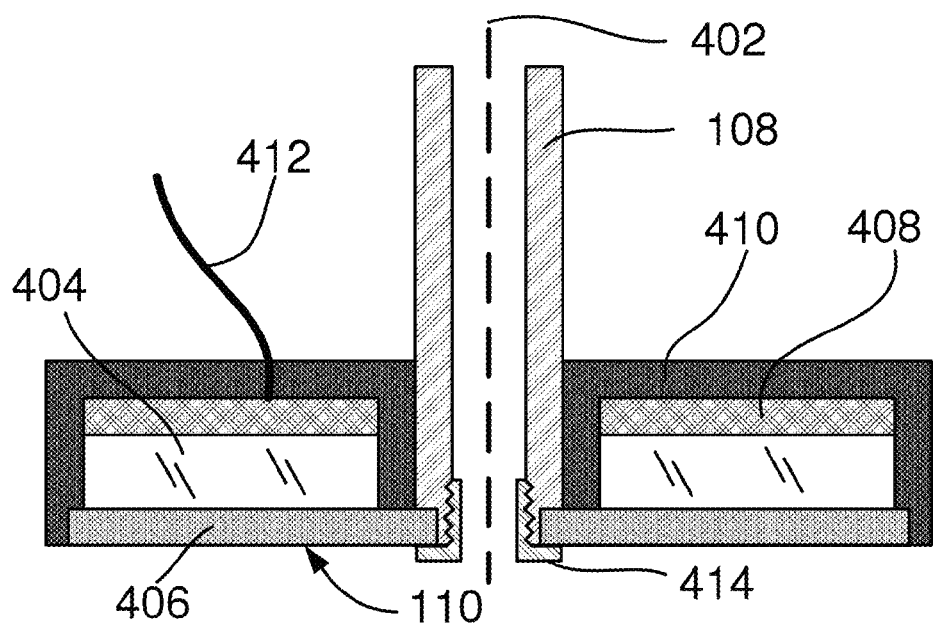
FIG. 4 schematically shows a charged particle detector for use in the lens of FIG. 1.

It is noted that an electrostatic lens system of four electrodes, in which, counting from the sample, the second electrode is covered by an SE detector, is shown in FIG. 4 of "Electron Specimen Interaction in Low Voltage Electron Beam Lithography", monthly progress reports, July 1995-October 1995, available at the internet: http://handle.dtic.mil/100.2/ADA327202.

In an embodiment of the column according to the invention at least part of the second electrode is positioned between the first and the second magnetic pole piece, and the first magnetic pole piece coincides with the first electrode.

According to this embodiment the second electrode may extend as a tube in the direction of the charged particle source, in which case the end of the second electrode closest to the sample carrier ends between the two magnetic pole pieces, and the first electrode coincides with the first pole piece. The second electrode ends in a circular disk with a central hole through which the beam of charged particles is guided to the sample. The face of the disk facing the sample is the sensitive surface of the detector.

In another embodiment of the column according to the invention the sensitive surface is a scintillator, and the detector further comprises a photon detector. By forming the sensitive surface as a scintillator, a charged particle impinging on the scintillator can generate one or more photons. Preferably these photons are then detected by a photon detector, such as a photo-diode, an avalanche photo-diode (APD), a Geiger mode APD, or arrays thereof, such as multi-pixel photon detector (also known as silicon photomultipliers, Si-PMT), CMOS device, or a CCD device, or a photo-multiplier tube (PMT)

It is noted that it is known to form a detector with more than one photon detector, so that the detector detects, for example, in which quadrant the charged particles impinge, or on what radius. The more than one photo detector can be formed on one device (wafer, chip), or can be physically separate devices placed adjacent to each other. The detector may comprise a light guide for guiding the photons from the scintillator to the photon detector.

It is noted that in this context a scintillator is to be interpreted as a material in which the impact of an energetic charged particle, such as an ion or an electron, results in the emission of one or more photons, and thus includes fluorescence, phosphorescence and photoluminescence. Examples of scintillators that are widely used in charged particle apparatuses (for example Scanning Electron Microscopes) are YAP:Ce (cerium doped yttrium aluminium perovskite, YAlO$_3$) and YAG:Ce (cerium doped yttrium aluminum garnet, Y$_3$Al$_5$O$_{12}$), powdered scintillators such as YSi$_2$O$_7$:Ce (also known as P47), or plastic scintillators such as NE102A. Scintillators are typically good electrically insulators, and to avoid charging these scintillators are coated with a thin layer (typically between 10 to 100 nm of, for example, aluminium) to provide a conductive layer. Scintillators with such a coating are commercially available. Also a coating with ITO (indium-tin oxide) can be used to provide an electrically conductive layer.

Preferably the scintillator has a potential of several kilovolts with respect to the sample, so that one charged particle, such as an electron, impinging on the scintillator is converted to more than one photon.

In another embodiment of the column according to the invention the charged particle source is an electron source and the beam of charged particles is a beam of electrons.

Preferably the column is a column producing a beam of electrons. Such a column is used in a Scanning Electron Microscope (SEM), but also in instruments where two columns, one producing a beam of electrons and one producing a beam of ions, are used. Such instruments are well-known to the person skilled in the art.

In a column for producing electrons best optical performance is obtained when the beam, travelling from the second electrode to the sample, is decelerated between the second electrode and the sample. This implies a potential of the second electrode that is positive with respect to the sample, and thus a potential that attracts electrons emerging from the sample as a result of the beam interacting with the sample, towards the sensitive surface.

It is noted that the charged particles detected need not be generated as a result of interaction of the sample with the beam produced by the column in which the detector is located: it may be that the beam from another column impinging on the sample causes the generation of the secondary charged particles that are subsequently detected. Such other column may, for example, be an ion column, the beam of ions for example machining the sample (etching and or sputtering) and also ejecting secondary electrons from the sample.

In another embodiment the detector is equipped with a conversion electrode for converting impinging ions (positive or negative) or electrons to electrons that are detected by the sensitive surface of the detector.

By equipping the column (in this context including the volume stretching from the first electrode to the sample) with a conversion electrode the detection of ions (positive or negative, charged atoms or molecules or clusters) and electrons can be optimized. It is noted that such a conversion electrode may be positioned at the source side of the first electrode, but also on the sample carrier side of the first electrode. Preferably the conversion electrode is biased with a voltage to attract the species of charged particles to be detected, and a potential negative with respect to the sensitive surface, so that electrons ejected from the conversion electrode are accelerated to the sensitive surface.

Preferably the column is part of a charged particle apparatus, such as a Scanning Electron Microscope (SEM), an apparatus with a column according to the an embodiment of invention and a Focused Ion Beam (FIB) column. Also a SEM equipped with a transmissed electron detector is within the scope of this invention, as are, for example, Electron Probe Micro Analysis tools.

In an aspect of the invention a method of detecting secondary and/or backscattered electrons emerging from a sample, the method comprises: providing a sample on a sample position, providing a charged particle column producing a beam of charged particles, the column equipped with an objective lens focusing the beam of charged particles on the sample, the objective lens having a first electrode near the sample and a second electrode more removed from the sample for generating a focusing electrostatic field, the objective lens having a first pole piece near the sample and a second pole piece more removed from the sample for generating a magnetic focusing field, the electrostatic focusing field and the magnetic focusing field showing overlap, providing a charged particle detector at the side of the first electrode opposite to the sample, accelerating secondary charged particles emanating from the sample to the charged particle detector, the charged particle detector showing a charged particle sensitive surface, is characterized in that the second electrode shows an electrode surface facing the sample, and the sensitive surface forms at least part of said electrode surface.

In an embodiment of the method according to the invention the charged particle sensitive surface is a scintillator and the method further comprises detecting the photons emitted by the scintillator as a result of charged particles impinging on the scintillator.

In yet another embodiment of the method according to the invention comprises guiding the photons from the scintillator to the photon detector with a light guide.

Some photon detectors can be placed sufficiently close to the scintillator to detect photons without the use of a light guide. However, due to spatial problems and/or the need to make an electric barrier, it may be attractive to use a light guide (e.g. quartz, which is a good electric insulator and shows good transmittance for a wide colour range, or PMMA).

In yet another embodiment of the method according to the invention the secondary charged particles are electrons.

In yet another embodiment of the method according to the invention the beam of charged particles is a beam of electrons.

In yet another embodiment of the method according to the invention the detector comprises a conversion electrode and the method further comprises guiding the charged particle emanating from the sample to the conversion electrode, the conversion electrode in response to the charged particles thereupon emitting electrons, the electrons guided to a detector sensitive to electrons.

Using this method the detector can be switched from a mode in which positive charged particles (ions, clusters) are detected to a mode in which negative charged particles (electrons, ions, clusters) are detected. Given a geometry of the electrodes and the pole pieces, and the excitation of the magnetic and electrostatic lenses, the potential and position of the sample may be changed to optimize detector efficiency.

It is noted that the detector sensitive to electrons may be the detector on the face of the second electrode, but may be another detector sensitive to electrons, such as a detector placed in a field free region within the second electrode.

In still another embodiment of the method according to the invention the method further comprises energizing a magnetic coil for generating a magnetic immersion field at the sample position.

For improved resolution (improved probe diameter) it is known to immerse the sample in a magnetic field. Such a magnetic field can be generated by placing a coil around the yoke of the objective lens, or by placing a coil under the sample.

Figure 1:
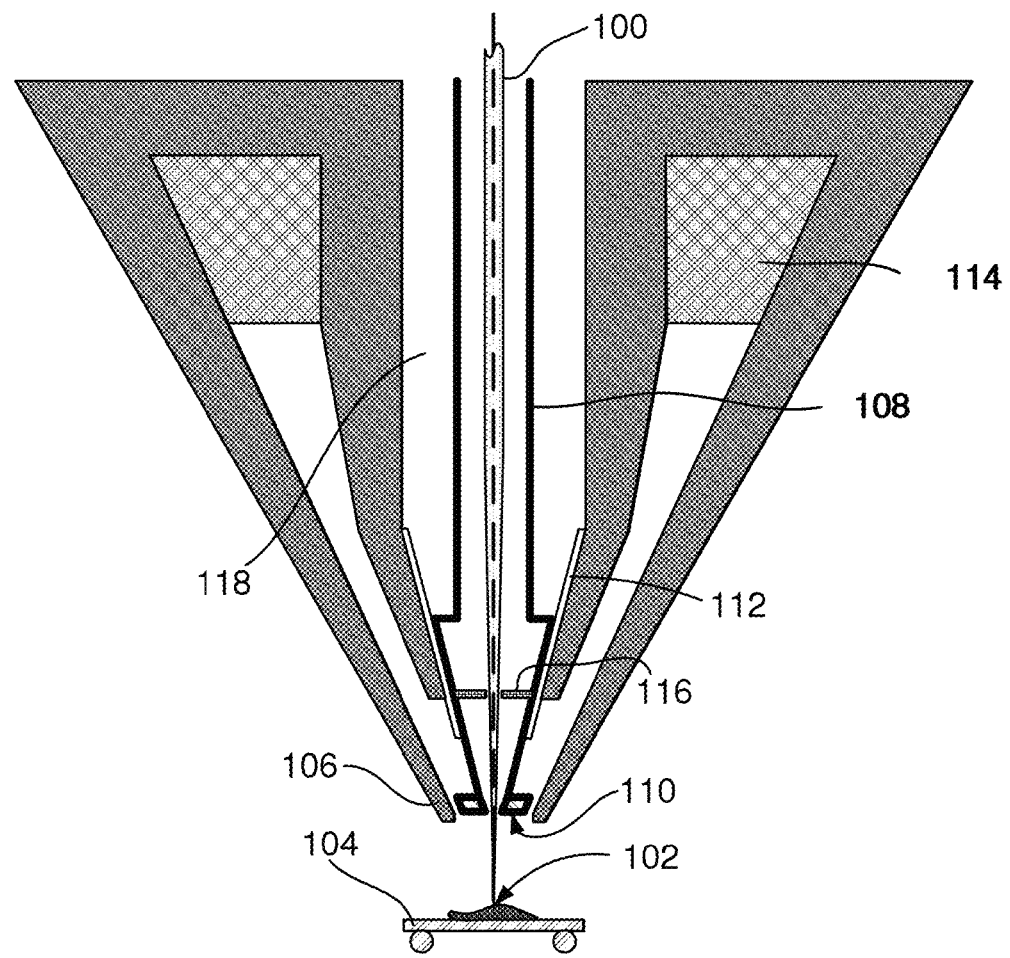
FIG. 1 schematically shows the objective lens according to the invention.

FIG. 1 schematically shows a beam of charged particles 100 impinging on a sample 102. The sample is mounted on a sample carrier 104 that is movable with respect to the beam. The objective lens comprises a magnetic yoke with two pole pieces guiding the magnetic field generated with coil 114 to an area near the beam. The yoke is connected to ground, and also forms the first electrode 106. The second electrode 108 is formed as a tube surrounding the beam, ending with a face 110 facing the sample. Insulator 112 centers the tube within the magnetic yoke and electrically insulates the two.

It is noted that the tube and the face need not be one piece, or even one material. Important for its functioning as one electrode is that the parts are sufficiently electrically conductive and electrically connected to each other.

On the face 110 a sensitive surface, such as a YAP:Ce or a YAG:Ce crystal is mounted. The photons generated by the scintillator are detected with a photon detector. As is clear from the figure, the scintillator should be formed as a disk with a central hole in it.

It is noted that the scintillator disk is preferably coated with a thin (10-100 nm) layer of aluminium, the coating forming a conductive layer and the coating reflecting photons that otherwise would emerge from the scintillator in the direction of the sample.

A second charged particle detector 116 is located in an electrically field free region within the second electrode. This second detector may, for example, be a solid state electron detector, or a detector comprising a scintillator and photon detector.

It is noted that magnetic deflectors can be placed in, for example, area 118 between the inner yoke and the second electrode.

It is mentioned that instead of a layer of aluminium a layer of indium-tin oxide (ITO) can be used.

It is noted that, as this lens uses both a magnetic and an electrostatic field for focusing the charged particles, this lens is less effective for ions than for electrons, as ions are less susceptible to the effect of a magnetic field than electrons due to their larger mass. The working of this embodiment is therefore further explained with (negatively charged) electrons.

The objective lens is a combined electrostatic and magnetic lens. Such a lens is already described in the known US patent, and especially when the energy with which the electrons enter the lens is higher than the energy with which they leave the lens (and thus impinges on the sample), the lens performance is superior of a simple magnetic or electrostatic lens. For practical reasons the magnetic yoke with the coil 114, and thus electrode 106, is normally connected to ground, but this is not a fundamental limitation.

It is noted that it is known to further decelerate the beam between the first electrode 106 and the sample position by biasing the sample to a positive energy.

The primary electrons, when impinging on the sample, cause the emission of secondary radiation, including back-scattered electrons (BSEs) and secondary electrons (SEs). From a detection point of view the difference between these two is that an SE is often defined as an electron emerging from the sample with an energy of less than 50 eV, or even 5 eV, while a BSE emerges from the sample with an energy above 50 eV (up to the energy of the primary beam). The electric field between the sample and the second electrode directs both these electrons towards the direction of face 110, and enter the magnetic field breaking out of the lens. The low energy electrons (all SEs and a small part of the BSEs) are kept so close to the axis that they travel through the hole in face 110 and enter the field free region within the second electrode. Many of these electrons then hit detector 116. The back-scattered electrons with a large energy, for example an energy in excess of 80% of the energy of the primary electrons, are less confined by the combined effect of the electrostatic and magnetic field and hit the face 110, and thus the scintillator, thereby generating photons to be detected by a photon detector.

Due to the potential difference between the sample and the second electrode, the BSEs impinge on the scintillator with an energy of several keV. Inventors found that, using the lens shown in FIG. 1, and with voltages of ground on sample and first electrode (and yoke) and a potential of approximately +8 kV on the second electrode, a detection efficiency for BSEs of 85% was obtained, depending on working distance (distance between sample and first pole piece), landing energy and BSE energy (influenced by for example a bias voltage between sample and first pole piece).

Figure 2:
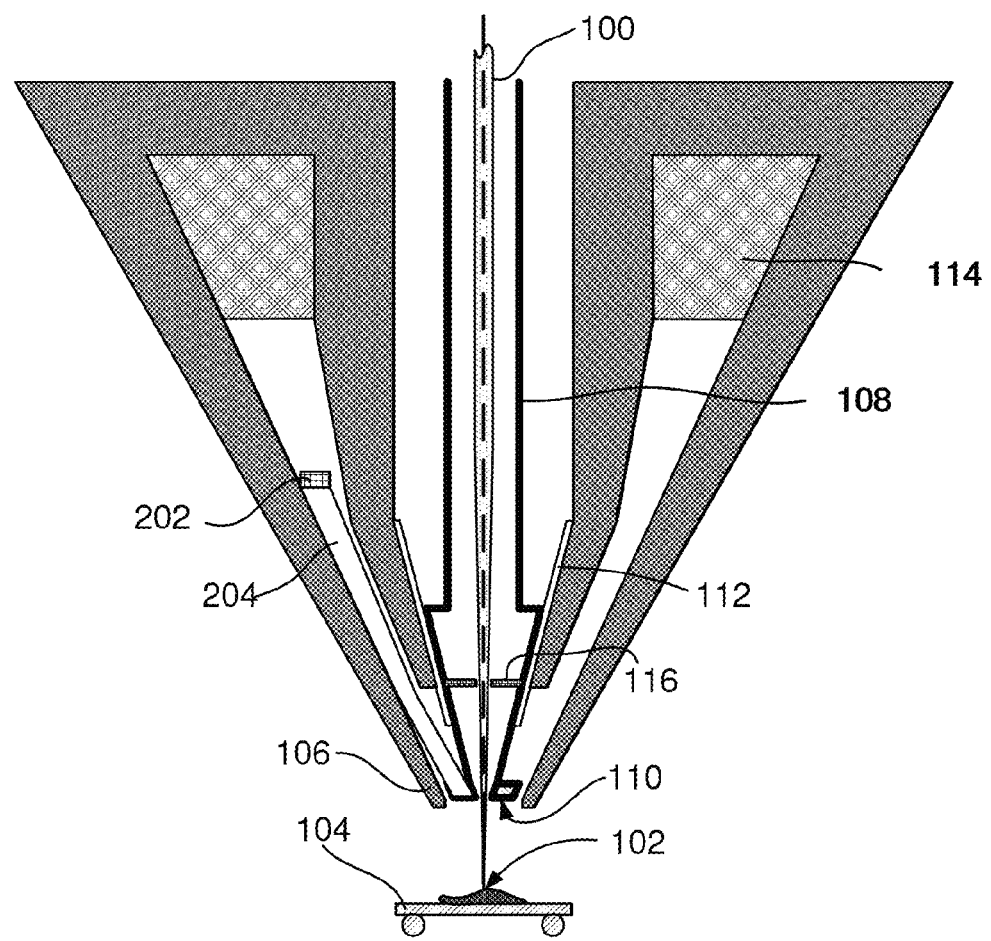
FIG. 2 schematically shows the lens of a charged particle column according to the invention, in which a photon detector is connected to the scintillator.

FIG. 2 schematically shows the lens of a charged particle column according to the invention, in which a photon detector is connected to the scintillator.

FIG. 2 can be thought to be derived from FIG. 1. Between a photon detector 202 and the face 110 of the second electrode, a light guide 204 is mounted to guide the photons from the scintillator to the photon detector. The light guide may be formed from, for example quartz, glass, or polymethylmethacrylate (PMMA), and need not be formed as a body showing symmetry round the beam 100. Instead, a number of fibers, for example 4, can be connected to four parts (quadrants) of the scintillator and guide the photons of each of these quadrants to a separate detector, such as a photo-diode, an avalanche photo-diode (APD), a Geiger mode APD, or arrays thereof, including a multi-pixel photon detector (also known as silicon photomultiplier, Si-PMT), a CMOS device, or a CCD device, or a PMT.

Figure 3:
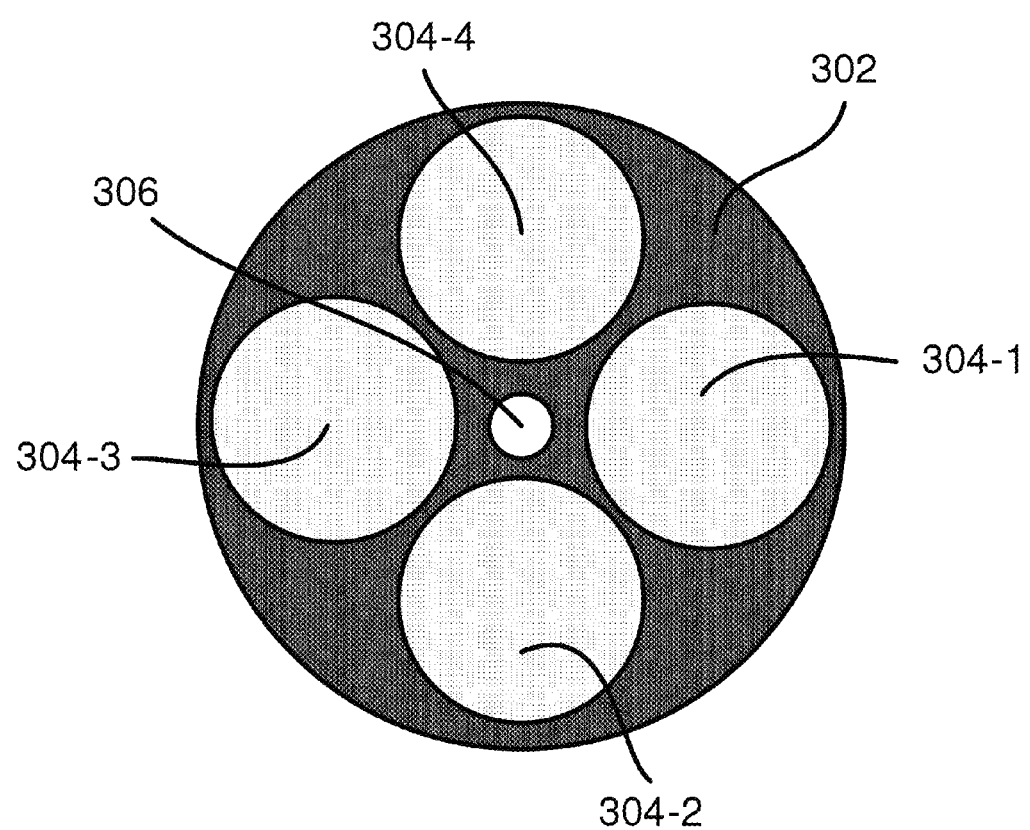
FIG. 3 schematically shows a scintillator with four uncoated windows.

FIG. 3 shows a scintillator with four uncoated windows for use in the lens of FIG. 2.

FIG. 3 shows a top view of the scintillator disk, that is, the side of the scintillator disk contacting the light guide. The disk shows a central bore 306 for passing the tube of the second electrode, and the beam of charged particles. The surface of the scintillator is covered with a coating 302 of aluminium, leaving only four windows 304-$i$, with $i=1\ldots 4$, open. As a result photons generated in the scintillator can only escape the scintillator disk via these windows, as the opposite side of the scintillator is also covered with an aluminium coating. It is noted that the inner and outer side of the scintillator may also be coated. Four cylindrical light guides or fibers are placed on the windows, and each of these light guides contacts a photo detector. The advantage of this embodiment is that the photon detector need not be an annular detector, but can be an assembly of simple disk shaped or rectangular photon detectors. Also quadrant detection is available in this manner.

FIG. 4 schematically shows a charged particle detector for use in the lens of FIG. 1.

FIG. 4 shows an axis 402 along which the beam of charged particles travel. A tube 108 surrounding the axis is part of the second electrode. An annular scintillator disk 406 is attached to the end of the tube with screw insert 414, which is screwed into the tube. The scintillator is placed against a glass, quartz, or PMMA annular disk forming the light guide 404 for guiding photons from the scintillator to the photon detector 408. The scintillator has a surface 110 opposite to the side where the light guide contacts the scintillator. The surface 110 is coated with a thin layer of aluminium, said layer making it electrically part of the second electrode, and also reflecting photons to the light guide 404. An electrical connection 412 provides a path from the photon detector to electronics. Part of the detector is molded in, for example, in an epoxy resin or silicon rubber 410 to avoid flash-overs from the tube (operating at a potential of several kV with respect to ground) to the photon detector (operating at ground potential).

When a charged particle, for example an electron, with an energy of several keV hits the scintillator 406, several photons are generated. Some will travel in the direction of the light guide 404, some in the direction of face 110. To detect all photons the parts of the scintillator not resting against the light guide are best covered by a highly reflective material, such as aluminium. A layer of between 10 nm and 100 nm aluminium is sufficiently transparent for the energetic electrons to enter the scintillator with sufficient energy, but reflects most of the photons. Preferably the side of the scintillator that is in contact with the light guide is matt to improve the coupling between the scintillator and the light guide. The light guide guides the photons to the photon detector 408, for example a photo diode, an avalanche photo-diode (APD), a Geiger mode APD, or arrays thereof, including a multi-pixel photon detector (also known as silicon photomultiplier, Si-PMT), a CMOS device, or a CCD device, or a PMT Preferably this photon detector operates at ground potential, implying that there is a potential difference of several kV between the tube 108 and aluminium coating at face 110 versus the photon detector 408. The light guide insulates this potential difference for punch through, and by encapsulating the detector in, for example, silicon rubber 410 also flash-overs are avoided. It is noted that the wire 412 should also be rated to withstand a high voltage.

It is noted that the scintillator disk may show one complete side where it is in contact with the light guide, but that also this side may be partly coated with aluminium so that a number of light guides (for example cylinders) may be placed on the uncoated parts, as shown in FIG. 3.

It is further noted that for both the SE detector 116 and the BSE detector a similar design may be used, but that this need not be the case: it is also possible to form the BSE detector with the light guides as shown in FIG. 2, and form the SE detector with a form as shown in FIG. 4, or vice versa. Also other types of detectors can be used, such as direct electron detectors (as described in, for example, European Patent Application No. EP2009705).

It is also noted that the light guide may be eliminated when the thickness of the scintillator is sufficient to provide the necessary isolation. As mentioned earlier, scintillators, and more specifically YAP, YAG and plastic scintillators are good insulators.

It is mentioned that the two different charged particle detectors, the one formed by the scintillator on face 110 and detector 116, can also be used to distinguish between (negatively charged) ions and clusters thereof and electrons, as the ions are less affected by the magnetic field and can thus travel further from the axis, to be detected on face 110, while the electrons are kept close to the axis by the magnetic field.

We claim as follows:

1. A charged particle column comprising:
   a charged particle source configured to produce a beam of charged particles;
   a sample carrier configured to hold and position a sample;
   an objective lens configured to focus the beam of charged particles on the sample, the objective lens comprising:
      a first electrode and a second electrode configured to generate a focusing electrostatic field, the first electrode positioned between the second electrode and the sample carrier, and
      a first pole piece and a second pole piece configured to generate a focusing magnetic field that overlaps the electrostatic field, the first pole piece positioned between the second pole piece and the sample carrier;
   a first charged particle detector comprising a surface sensitive to charged particles, wherein the surface sensitive to charged particles faces the sample carrier and acts as one of the surfaces of the second electrode; and
   a second charged particle detector disposed upstream of the first charged particle detector and inside the second electrode.

2. The charged particle column of claim 1 in which at least part of the second electrode is positioned between the first magnetic pole piece and the second magnetic pole piece, and the first magnetic pole piece coincides with the first electrode.

3. The charged particle column of claim 1 in which the first charged particle detector comprises a scintillator coupled to a photon detector.

4. The charged particle column of claim 3 in which the photon detector comprises a photo-diode, an avalanche photo-diode (APD), a Geiger mode APD, a multi-pixel photon detector, a CMOS device, a CCD device, or a PMT.

5. The charged particle column of claim 3 further comprising a light guide configured to guide photons produced by the scintillator to the photon detector.

6. The charged particle column of claim 3 in which the second electrode is biased at a high potential with respect to the sample to attract charged particles emanating from the sample, and the photon detector is biased at ground potential.

7. The charged particle apparatus of claim 3 in which the charged particles impinging on the scintillator are at least in part electrons emitted by a conversion electrode, said electrons caused by positive or negative ions and/or electrons impinging on the conversion electrode.

8. The charged particle column of claim 1 in which the charged particle source is an electron source and the beam of charged particles is a beam of electrons.

9. The charged particle column of claim 1 in which the column further comprises a further charged particle detector in a field free region inside the second electrode.

10. A charged particle apparatus comprising a charged particle column according to claim 1.

11. A method of detecting secondary and backscattered electrons emerging from a sample mounted on a sample carrier using a charged particle column,
   the charged particle column comprising:
      a charged particle source;
      an objective lens comprising a first electrode, a second electrode, a first magnetic pole piece, and a second magnetic pole piece, wherein the first electrode terminates closer to the sample than the second electrode and the first magnetic pole piece terminates closer to the sample than the second magnetic pole piece;
      a first charged particle detector comprising a surface sensitive to charged particles, the surface sensitive to charged particles facing the sample and electrically connected to the second electrode; and
      a second charged particle detector located inside the second electrode and further away from the sample than the surface sensitive to charged particles, and
   the method comprising:
      producing a beam of charged particles from the charged particle source;
      focusing the beam of charged particles on the sample by generating a focusing electrostatic field using the first electrode and the second electrode and by shaping a magnetic focusing field using the first magnetic pole piece and the second magnetic pole piece, wherein the electrostatic focusing field overlaps the magnetic focusing field and the surface sensitive to charged particles functions as a face of the second electrode;
      detecting, with the first charged particle detector, electrons having energies above 50 eV that emanate from the sample and hit the surface sensitive to charged particles; and
      detecting electrons having energies below 50 eV with the second charged particle detector.

12. The method of claim 11 wherein the first charged particle detector comprises a scintillator, the surface sensitive to charged particles being a surface of the scintillator, and a photon detector, and further comprising:
   detecting, with the photon detector, photons emitted by the scintillator as a result of charged particles impinging on the surface sensitive to charged particles.

13. The method of claim 12 in which the first charged particle detector comprises a light guide and the light guide guides the photons to the photon detector.

14. The method of claim 12 in which the charged particles impinging on the scintillator are at least in part electrons emitted by a conversion electrode as a result of positive or negative ions and/or electrons impinging on the conversion electrode.

15. The method of claim 11 in which the electrons having energies below 50 eV are secondary electrons.

16. The method of claim 11 in which the beam of charged particles is a beam of electrons.

17. The method of claim 11 wherein the second charged particle detector is mounted in a field free region inside the second electrode and further comprising:
   detecting, with the first charged particle detector, backscattered electrons hitting the surface sensitive to charged particles; and
   detecting secondary electrons with the second charged particle detector.

18. The method of claim 11 wherein the charge particle column is part of an apparatus equipped with a conversion electrode and further comprising:
   guiding charged particles emanated from the sample to the conversion electrode such that the emanated charged particles impinge the conversion electrode and electrons are emitted from the conversion electrode as a result of the emanated charged particles impinging the conversion electrode; and
   detecting the electrons emitted from the conversion electrode with the surface sensitive to charged particles of the first charged particle detector or with another detector sensitive to electrons.

19. The method according to claim 11 wherein the charged particle column comprises a magnetic coil and further comprising:
  energizing the magnetic coil such that a magnetic immersion field is generated at a position of the sample.

20. A charged particle column comprising:
  a charged particle source configured to produce a beam of charged particles;
  an objective lens configured to focus the beam of charged particles on a sample, the objective lens having a first electrode and a second electrode, the first electrode and the second electrode configured to generate a focusing electrostatic field; and
  a charged particle detector in the objective lens comprising an electrically conductive surface sensitive to charged particles and facing the sample,
  wherein the electrically conductive surface is in contact with the second electrode, electrically connected to the second electrode, and configured to form the electrostatic focusing field by functioning as a face of the second electrode.

21. The charged particle column of claim 20 wherein the electrically conductive surface is configured to detect backscattered electrons emitted as a result of the beam of charged particles impinging on a sample.

\* \* \* \* \*